United States Patent
Feng et al.

(10) Patent No.: US 9,065,421 B2
(45) Date of Patent: Jun. 23, 2015

(54) FILM BULK ACOUSTIC RESONATOR WITH MULTI-LAYERS OF DIFFERENT PIEZOELECTRIC MATERIALS AND METHOD OF MAKING

(75) Inventors: Chris Feng, Fort Collins, CO (US); John Choy, Westminster, CO (US); Kevin J. Grannen, Thornton, CO (US); Phil Nikkel, Loveland, CO (US); Tom Yeh, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 608 days.

(21) Appl. No.: 13/362,321

(22) Filed: Jan. 31, 2012

(65) Prior Publication Data

US 2013/0193808 A1 Aug. 1, 2013

(51) Int. Cl.
*H01L 41/09* (2006.01)
*H03H 9/12* (2006.01)
*H03H 9/17* (2006.01)
*H03H 9/02* (2006.01)
*H03H 9/58* (2006.01)

(52) U.S. Cl.
CPC ............... *H03H 9/173* (2013.01); *Y10T 29/42* (2015.01); *H03H 9/02149* (2013.01); *H03H 9/171* (2013.01); *H03H 9/178* (2013.01); *H03H 9/585* (2013.01)

(58) Field of Classification Search
USPC ............................ 310/320–322, 357–359, 366
See application file for complete search history.

(56) References Cited

U.S. PATENT DOCUMENTS

| | | | |
|---|---|---|---|
| 5,410,205 A * | 4/1995 | Gururaja | 310/328 |
| 5,587,620 A | 12/1996 | Ruby et al. | |
| 5,873,153 A | 2/1999 | Ruby et al. | |
| 5,929,555 A * | 7/1999 | Sugimoto et al. | 310/360 |
| 6,075,183 A * | 6/2000 | Knutzon et al. | 800/281 |
| 6,107,721 A | 8/2000 | Lakin | |
| 6,384,697 B1 | 5/2002 | Ruby | |
| 6,441,539 B1 * | 8/2002 | Kitamura et al. | 310/346 |
| 6,507,983 B1 | 1/2003 | Ruby et al. | |
| 7,275,292 B2 | 10/2007 | Ruby et al. | |
| 7,280,007 B2 | 10/2007 | Feng et al. | |
| 7,323,953 B2 | 1/2008 | Yokoyama et al. | |
| 7,367,095 B2 * | 5/2008 | Larson et al. | 29/25.35 |
| 7,372,346 B2 | 5/2008 | Tilmans et al. | |
| 7,388,454 B2 | 6/2008 | Ruby et al. | |
| 7,629,865 B2 | 12/2009 | Ruby | |

(Continued)

OTHER PUBLICATIONS

Chao, et al. "Accurate explicit formulae of the fundamental mode resonant frequencies for FBAR with thick electrodes", Proceedings of the 2003 IEEE International Frequency Control Symposium and PDA Exhibition Jointly with the 17th European Frequency and Time Forum, p. 794-801.

*Primary Examiner* — Thomas Dougherty

(57) ABSTRACT

A thin film bulk acoustic resonator (FBAR) includes a first electrode, a first piezoelectric layer having a first c-axis orientation and on the first electrode, a second piezoelectric layer having a second c-axis orientation over the first piezoelectric layer, and a second electrode on the second piezoelectric layer. The first and second piezoelectric layers are made of respective different piezoelectric materials. The FBAR can be set to have different resonance frequencies by selecting the first and second c-axis orientations to be respectively the same or different. The high and low frequency range of the FBAR can thus be extended.

14 Claims, 3 Drawing Sheets

(56) References Cited

U.S. PATENT DOCUMENTS

| | | | |
|---|---|---|---|
| 7,889,024 B2* | 2/2011 | Bradley et al. | 333/133 |
| 2004/0227590 A1* | 11/2004 | Larson et al. | 333/189 |
| 2007/0139140 A1 | 6/2007 | Rao et al. | |
| 2007/0205850 A1 | 9/2007 | Jamneala et al. | |
| 2010/0327697 A1 | 12/2010 | Choy et al. | |
| 2010/0327994 A1 | 12/2010 | Choy et al. | |
| 2011/0121689 A1* | 5/2011 | Grannen et al. | 310/357 |
| 2012/0206216 A1* | 8/2012 | Deguet et al. | 333/189 |

* cited by examiner

US 9,065,421 B2

FILM BULK ACOUSTIC RESONATOR WITH MULTI-LAYERS OF DIFFERENT PIEZOELECTRIC MATERIALS AND METHOD OF MAKING

BACKGROUND

Transducers generally convert electrical signals to mechanical signals or vibrations, and/or mechanical signals or vibrations to electrical signals. Acoustic transducers, in particular, convert electrical signals to acoustic signals (sound waves) and convert received acoustic waves to electrical signals via inverse and direct piezoelectric effect. Acoustic transducers generally include acoustic resonators, such as thin film bulk acoustic resonators (FBARs), surface acoustic wave (SAW) resonators or bulk acoustic wave (BAW) resonators, and may be used in a wide variety of electronic applications, such as cellular telephones, personal digital assistants (PDAs), electronic gaming devices, laptop computers and other portable communications devices. For example, FBARs may be used for electrical filters and voltage transformers. Generally, an acoustic resonator has a layer of piezoelectric material between two conductive plates (electrodes), which may be formed on a thin membrane. FBAR devices, in particular, generate longitudinal acoustic waves and lateral (or transverse) acoustic waves when stimulated by an applied time-varying electric field, as well as higher order harmonic mixing products.

Stacked bulk acoustic resonators (SBARs) include a second FBAR stacked upon a first FBAR. A type of SBAR characterized as a double FBAR (DBAR) may include two layers of piezoelectric material with three electrodes in a single stack. That is, a first layer of piezoelectric material is formed between a bottom electrode and a middle electrode, and a second piezoelectric material is formed between the middle electrode and a top electrode. Generally, DBARs allow reduction of the area of a single bulk acoustic resonator device by about half Examples of SBARs and FBARs, as well as their materials and construction, may be found in U.S. Pat. No. 7,367,095 to Larson, III et al., published May 6, 2008, which is hereby incorporated by reference.

There is an increasing demand to extend the frequency range of acoustic resonators for use in compact devices such as cellular phones for example. What is needed therefore is structure and construction method that extends the resonance frequency of acoustic resonators for both high frequency and low frequency applications.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
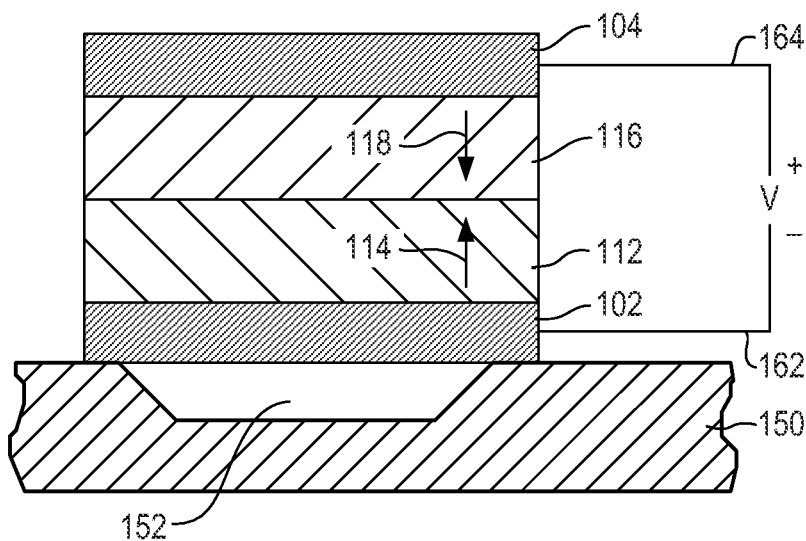
FIG. 1 is a cross-sectional view illustrating a thin film bulk acoustic resonator (FBAR), according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

Further, as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Certain aspects of the present teachings build upon components of FBAR devices, FBAR-based filters, their materials and methods of fabrication. Certain details of BAW resonators and resonator filters, materials thereof and their methods of fabrication may be found in one or more of the following commonly owned U.S. Patents and Patent Applications: U.S. Pat. No. 6,107,721 to Lakin; U.S. Pat. Nos. 5,587,620, 5,873,153, 6,507,983, 6,384,697, 7,275,292 and 7,629,865 to Ruby et al.; U.S. Pat. No. 7,280,007 to Feng, et al.; U.S. Patent App. Pub. No. 2007/0205850 to Jamneala et al.; U.S. Pat. No. 7,388,454 to Ruby et al.; U.S. Patent App. Pub. No. 2010/0327697 to Choy et al.; and U.S. Patent App. Pub. No. 2010/0327994 to Choy et al. The disclosures of these patents and patent applications are specifically incorporated herein by reference. It is emphasized that the components, materials and method of fabrication described in these patents and patent applications are representative and other methods of fabrication and materials within the purview of one of ordinary skill in the art are contemplated.

Many details of FBARs, materials thereof and their methods of fabrication may be found in U.S. Pat. No. 7,367,095 (May 6, 2008) to Larson, III et al. The disclosure of this patent is hereby incorporated by reference. It is emphasized that the components, materials and method of fabrication described in this patent is representative and other methods of fabrication and materials within the purview of one of ordinary skill in the art are contemplated.

FIG. 1 shows a cross-sectional view of a thin film bulk acoustic resonator (FBAR) 10 on substrate 150, in accordance with a representative embodiment. Substrate 150 may be a material compatible with semiconductor processes, such as silicon (Si), gallium arsenide (GaAs), indium phosphide (InP), glass, sapphire, alumina, or the like, for example. Substrate 150 may be etched to form cavity (pool) 152, and a layer of sacrificial material (not shown) such as oxide, polysilicon or other suitable material may be deposited on substrate 150 to fill cavity 152. Substrate 150 may then be planarized so that the sacrificial material remains only in cavity 152. Incidentally, the sacrificial material may be removed by etching after formation of FBAR, 10 to open cavity 152.

FBAR 10 includes a first (bottom) electrode 102 formed on substrate 150 over cavity 152. A layer of tungsten (W), molybdenum (Mo) or aluminum (Al) for example, may be deposited on substrate 150 and subsequently patterned in the shape of a polygon or the like, to form first electrode 102. A piezoelectric material such as aluminum nitride (AlN) may then be deposited on first electrode 102 by plasma deposition for example, to form first piezoelectric layer 112 having a (first) c-axis orientation indicated, by arrow 114 that is a normal c-axis orientation for AlN. A piezoelectric material such as zinc oxide (ZnO) may then be directly deposited on first piezoelectric layer 112 by plasma deposition to form second piezoelectric layer 116 having a (second) c-axis orientation as indicated by arrow 118 that is a normal c-axis orientation for ZnO. In this representative embodiment, first and second piezoelectric layers 112 and 116 are respective different piezoelectric materials. Also, the c-axis orientation of first piezoelectric layer 112 as indicated by arrow 114 is opposite the c-axis orientation of second piezoelectric layer 116 as indicated by arrow 118. A layer of tungsten (W), molybdenum (Mo) or aluminum (Al) for example, may then be deposited on second piezoelectric layer 116 to form second (top) electrode 104. First and second piezoelectric layers 112 and 116, and second electrode 104 may then be patterned to form FBAR 10. The sacrificial material as noted above may then be removed by etching, so that FBAR 10 is disposed as suspended over empty cavity 152. A passivation layer (not shown) may then be formed on FBAR 10 to protect FBAR 10. Corresponding contacts (not shown) and leads 162 and 164 may then be formed as electrically connected respectively to first electrode 102 and second electrode 104, as schematically shown. A voltage V may be applied to FBAR 10 between leads 162 and 164. FBAR 10 thus includes first piezoelectric layer 112 laminated to second piezoelectric layer 116, and may therefore be characterized as a composite FBAR.

Figure 2:
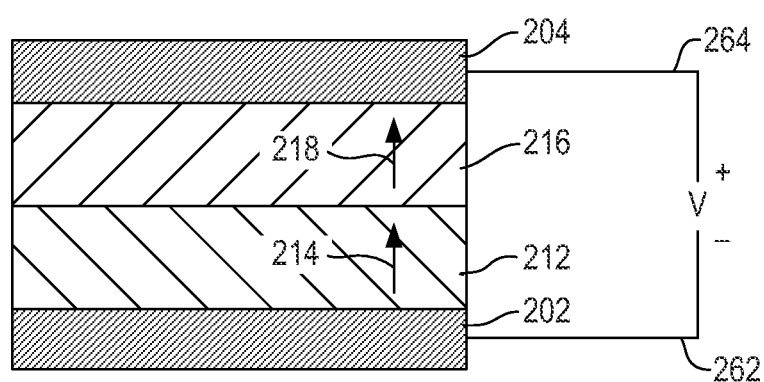
FIG. 2 is a cross-sectional view illustrating an FBAR, according to a representative embodiment.

FIG. 2 shows a cross-sectional view of a thin film bulk acoustic resonator FBAR 20, in accordance with a representative embodiment. FBAR 20 may include similar features as FBAR 10 shown in FIG. 1, including somewhat similar reference numerals. Description of such similar features may be omitted from the following. FBAR 20 may be formed on a substrate such as substrate 150 which includes cavity 152 as shown in FIG. 1 for example. However, a corresponding substrate and cavity are omitted from FIG. 2 for the sake of simplifying the figure.

FBAR 20 as shown in FIG. 2 may include a first (bottom) electrode 202, which may be tungsten (W), molybdenum (Mo) or aluminum (Al) for example, on a substrate (not shown), and may further include first piezoelectric layer 212, which may be a piezoelectric material such as AlN, on first electrode 202. First piezoelectric layer 212 may be formed by plasma deposition for example, and may have a (first) c-axis orientation indicated by arrow 214 that is a normal c-axis orientation for AlN. FBAR 20 may further include a second piezoelectric layer 216, which may be a piezoelectric material such as ZnO, on first piezoelectric layer 212. Second piezoelectric layer 216 may be formed by plasma deposition for example, and in contrast to the representative embodiment of FIG. 1, may be formed to have a (second) c-axis orientation as indicated by arrow 218 that is a reverse c-axis orientation for ZnO. In this representative embodiment, first and second piezoelectric layers 212 and 216 are respective different piezoelectric materials. Also, the c-axis orientation of first piezoelectric layer 212 as indicated by arrow 214 is the same as the c-axis orientation of second piezoelectric layer 216 as indicated by arrow 218.

In particular, first piezoelectric layer 212, may be a piezoelectric material such as AlN. In order to provide second piezoelectric layer 216 as having a reverse c-axis orientation, a thin zinc (Zn) seed layer (not shown) having a thickness of about several to several hundred angstroms for example, may be first formed on first piezoelectric layer 212 by plasma deposition. ZnO may be subsequently grown on the Zn seed layer by standard plasma deposition to form second piezoelectric layer 216 having a reverse c-axis orientation. A layer of tungsten (W), molybdenum (Mo) or aluminum (Al) for example, may then be deposited on second piezoelectric layer 216 to form second (top) electrode 204. The first and second piezoelectric layers 212 and 216, and second electrode 204 may then be patterned to form FBAR 20. The sacrificial material as noted above may then be removed from the corresponding cavity (not shown) by etching. An overlying passivation layer (not shown) may then be formed to protect FBAR 20. Corresponding contacts (not shown) and leads 262 and 264 may then be formed as electrically connected respectively to first electrode 202 and second electrode 204, as schematically shown. A voltage V may be applied to FBAR 20 between leads 262 and 264. FBAR 20 thus includes first piezoelectric layer 212 laminated to second piezoelectric layer 216, and may therefore be characterized as a composite FBAR.

In other representative embodiments, the piezoelectric material of first piezoelectric layer 112 (212) and the piezoelectric material of second piezoelectric layer 116 (216) may respectively be combinations of AlN, ZnO, polyvinylidene fluoride (PVDF) and lead zirconate titanate (PZT), for example. The thicknesses of first and second electrodes 102 (202) and 104 (204) may typically be in a range of about several hundred angstroms to several microns, for example. The thicknesses of first piezoelectric layer 112 (212) and second piezoelectric layer 116 (216) may typically be in a range of about several thousand angstroms to several microns for example. It should however be understood that the thicknesses of the various layers and the piezoelectric material as noted above are merely given as examples, and may be varied in accordance with specific applications as would be understood by one of ordinary skill. Also, the layers may be juxtaposed. For example, first piezoelectric layer 112 (212) may be ZnO and second piezoelectric layer 116 (216) may be AlN.

Also, although the FBARs FIGS. 1 and 2 are shown as respectively including one first piezoelectric layer 112 (212) and one second piezoelectric layer 116 (216), the FBARs of representative embodiments may each include a plurality of respective pairs of first piezoelectric layer 112 (212) and second piezoelectric layer 116 (216). For example, FBAR 10 shown in FIG. 1 may be configured as a sequential stack including a first piezoelectric layer 112, a second piezoelectric layer 116, another first piezoelectric layer, and another second piezoelectric, etc., sandwiched between first and second electrodes 102 and 104. FBAR 20 shown in FIG. 2 may be configured in a similar manner as a sequential stack sandwiched between first and second electrodes 202 and 204.

In the representative embodiments described above with respect to FIGS. 1 and 2, first piezoelectric layer 112 (212) and second piezoelectric layer 116 (216) are laminated together, are formed of respective different piezoelectric material, and may be made to have respective first and second c-axis orientations that are different to set a first resonance frequency, or the same to set a second resonance frequency. In contrast, a conventional FBAR includes a piezoelectric layer constituted of a single piezoelectric material such as AlN or ZnO without different respective piezoelectric material, and thus has a substantially single, uniform c-axis orientation. That is, the piezoelectric layer of such a conventional FBAR is not made of respective different piezoelectric materials that can be set to have respective different c-axis orientations.

Table 1 shows example thicknesses, along with corresponding c-axis orientations and resultant resonance frequencies, for the FBARs of the representative embodiments shown in FIGS. 1 and 2. In both cases, the thicknesses of the first electrode the first piezoelectric layer, the second piezoelectric layer and the second electrode of FBARs 10 and 20 shown in FIGS. 1 and 2 are respectively set to 1753 Å, 6000 Å, 4160 Å and 1753 Å. FBAR 10 as shown in FIG. 1 including the corresponding layer thicknesses with first piezoelectric layer 112 and second piezoelectric layer 116 having respective different (opposite) c-axis orientations has a resonance frequency of about 5000 MHz. FBAR 20 as shown in FIG. 2 including the corresponding layer thicknesses with first piezoelectric layer 212 and second piezoelectric layer 216 having the same c-axis orientations has a resonance frequency of about 2243 MHz.

TABLE 1

| Layer | Thickness (Å) | FIG. 1 c-axis | FIG. 1 Fs (MHz) | FIG. 2 c-axis | FIG. 2 Fs (MHz) |
|---|---|---|---|---|---|
| top (second) electrode (W) | 1753 | | 5000 | | 2243 |
| piezoelectric layer 2 (ZnO) | 4160 | ↓↓↓ | | ↑↑↑ | |
| piezoelectric layer 1 (AlN) | 6000 | ↑↑↑ | | ↑↑↑ | |
| bottom (first) electrode (W) | 1753 | | | | |

Accordingly, as can be understood in view of Table 1, the corresponding resonance frequencies of the FBARs 10 and 20 of the representative embodiments having first and second piezoelectric layers of different respective piezoelectric material can be controlled or set by merely selecting the c-axis orientations of the first and second piezoelectric layers to be formed. That is, in the case of the representative embodiments having the representative thicknesses in Table 1, when first and second piezoelectric layers 212 and 216 are selected to be the same as in the case of FBAR 20 shown in FIG. 2, the resonance frequency is set to about 2243 MHz. When first and second piezoelectric layers 112 and 116 are selected to be different (opposite) as in the case of FBAR 10 shown in FIG. 1, the resonance frequency is set to about 5000 MHz. That is, the resonance frequency may be set based on the respective c-axis orientations of the first and second piezoelectric layers.

In contrast, in conventional FBARs which include a piezoelectric layer sandwiched between respective electrodes whereby the piezoelectric layer is constituted of a single piezoelectric material, resonance frequency can be changed primarily by varying a thickness of the piezoelectric layer and/or the electrodes. That is, the resonance frequency of such conventional FBARs may be increased by making the piezoelectric layer and/or the electrodes thinner. The resonance frequency of such conventional FBARs may be decreased by making the piezoelectric layer and/or the electrodes thicker.

By growing second piezoelectric layer 216 to have a same c-axis orientation as first piezoelectric layer 212 as shown in FIG. 2, FBAR 20 may be realized as having lower resonance frequency without increasing overall thickness, as would be necessary to lower the resonance frequency of a conventional FBAR. In this case, FRAR 20 operates in ½ lambda mode. In accordance with the representative embodiments, FBARs of extended low frequency range may be constructed without increased thickness. Also, by growing second piezoelectric layer 116 to have a different c-axis orientation than first piezoelectric layer 112 shown in FIG. 1, FBAR 10 may be realized as having higher resonance frequency without excessively decreasing the thickness of first and second piezoelectric layer 112 and 116 and first and second electrodes 102 and 104, as would be necessary to increase the resonance frequency of conventional FBARs. Such excessive reduction of the thickness of the piezoelectric layers and the electrodes would adversely reduce the coupling coefficient kt2 and the Q factor of the conventional FBARs, and would also result in the FBAR being too small. In accordance with the representative embodiments, FBAR operation may be extended to a high frequency range of about 3-5 GHz or greater. In this case, FBAR 10 operates in lambda mode.

Figure 3:
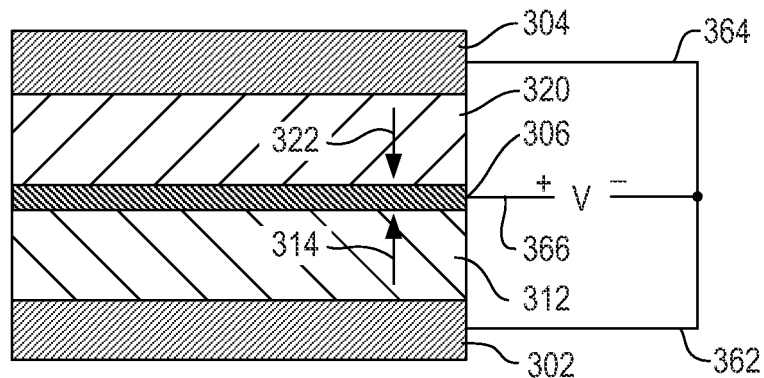
FIG. 3 is a cross-sectional view illustrating a double thin film bulk acoustic resonator (DBAR), according to a representative embodiment.

FIG. 3 shows a cross-sectional view of a double thin film bulk acoustic resonator (DBAR) 30, in accordance with a representative embodiment. DBAR 30 may include similar features as FBAR 10 shown in FIG. 1, including somewhat similar reference numerals. Description of such similar features may be omitted from the following. DBAR 30 may be formed on a substrate such as substrate 150 which includes cavity 152 as shown in FIG. 1 for example. However, a corresponding substrate and cavity are omitted from FIG. 3 for the sake of simplifying the figure.

DBAR 30 as shown in FIG. 3 may include a first (bottom) electrode 302, which may be tungsten (W), molybdenum (Mo) or aluminum (Al), on a substrate (not shown), and may further include first piezoelectric layer 312, which may be a piezoelectric material such as AlN, on first electrode 302. First piezoelectric layer 312 may be formed by plasma deposition for example, and may have a (first) c-axis orientation indicated by arrow 314 that is a normal c-axis orientation for AlN. DBAR 30 may also include a third (middle) electrode 306 formed on first piezoelectric layer 312. A layer of tungsten (W), molybdenum (Mo) or aluminum (Al), for example, may be deposited on first piezoelectric layer 312 to form third electrode 306. DBAR 30 may further include a second piezoelectric layer 320, which may be a piezoelectric material such as ZnO, on third electrode 306. Second piezoelectric layer 320 may be formed by plasma deposition for example, to have a (second) c-axis orientation as indicated by arrow 322 that is a normal c-axis orientation for ZnO. In this representative embodiment, first and second piezoelectric layers 312 and 320 are respective different piezoelectric materials. Also, the c-axis orientation of first piezoelectric layer 312 as indicated by arrow 314 is different (opposite) than the c-axis orientation of second piezoelectric layer 320 as indicated by arrow 322. A layer of tungsten (W), molybdenum (Mo) or aluminum (Al), for example, may then be deposited on second piezoelectric layer 320 to form second (top) electrode 304. First and second piezoelectric layers 312 and 320, and second and third electrodes 304 and 306 may then be patterned to form DBAR 30. The sacrificial material may then be removed from the corresponding cavity (not shown) by etching. An overlying passivation layer (not shown) may then be formed to protect DBAR 30.

Corresponding contacts (not shown) and leads 362, 364 and 366 may then be formed as electrically connected respectively to first electrode 302, second electrode 304 and third electrode 306, as schematically shown. Leads 362 and 364 may be connected together, so that first and second electrodes 302 and 304 may be electrically connected together. A voltage V may be applied to DBAR 30 between lead 366, and a junction connecting leads 362 and 364. DBAR 30 thus includes first piezoelectric layer 312 sandwiched between first and third electrodes 302 and 306, and second piezoelectric layer 320 sandwiched between second and third electrodes 304 and 306. In this representative embodiment of FIG. 3. DBAR 30 may be characterized as having a second FBAR stacked upon a first FBAR, whereby the c-axis orientations of the two FBARs are different (opposite). DBAR 30 as configured in FIG. 3 thus operates in ½ lambda mode, resulting in lower resonance for low frequency operation.

Figure 4:
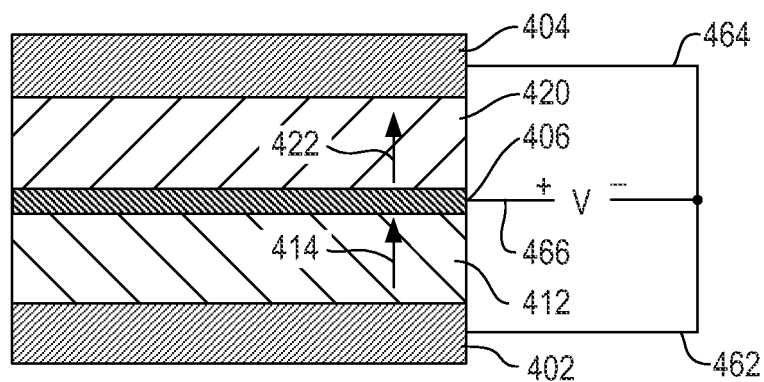
FIG. 4 is a cross-sectional view illustrating a DBAR, according to a representative embodiment.

FIG. 4 shows a cross-sectional view of DBAR 40, in accordance with a representative embodiment, DBAR 40 may include similar features as FBAR 10 and DBAR 30 as respectively shown in FIGS. 1 and 3, including somewhat similar reference numerals. Description of such similar features may be omitted from the following. DBAR 40 may be formed on a substrate such as substrate 150 which includes cavity 152 as shown in FIG. 1 for example. However, a corresponding substrate and cavity are omitted from FIG. 4 for the sake of simplifying the figure.

DBAR 40 as shown in FIG. 4 may include a first (bottom) electrode 402, which may be tungsten (W), molybdenum (Mo) or aluminum (Al), on a substrate (not shown), and may further include first piezoelectric layer 412, which may be a piezoelectric material such as AlN, on first electrode 402. First piezoelectric layer 412 may be formed by plasma deposition for example, and may have a (first) c-axis orientation indicated by arrow 414 that is a normal c-axis orientation for AlN. DBAR 40 may also include a third (middle) electrode 406 formed on first piezoelectric layer 412. A layer of tungsten (W), molybdenum (Mo) or aluminum (Al), for example, may be deposited on first piezoelectric layer 412 and subsequently patterned to form third electrode 406. DBAR 40 may further include a second piezoelectric layer 420, which may be a piezoelectric material such as ZnO, on third electrode 406. Second piezoelectric layer 420 may be formed by plasma deposition for example, to have a (second) c-axis orientation as indicated by arrow 422 that is a reverse c-axis orientation for ZnO. In order to provide second piezoelectric layer 420 as having reverse c-axis orientation, a thin zinc (Zn) seed layer (not shown) having a thickness of about a few to several hundred angstroms for example, may be first formed on third electrode 406 by plasma deposition, ZnO may be subsequently grown on the Zn seed layer by standard plasma deposition to form second piezoelectric layer 420 having a reverse c-axis orientation. In this representative embodiment, first and second piezoelectric layers 412 and 420 are respective different piezoelectric materials. Also, the c-axis orientation of first piezoelectric layer 412 as indicated by arrow 414 is the same as the c-axis orientation of second piezoelectric layer 420 as indicated by arrow 422. A layer of tungsten (W), molybdenum (Mo) or aluminum (Al), for example, may then be deposited on second piezoelectric layer 420 to form second (top) electrode 404. First and second piezoelectric layers 412 and 420, and second and third electrodes 404 and 406 may then be patterned to form DBAR 40. The sacrificial material may then be removed from the corresponding cavity (not shown) by etching. An overlying passivation layer (not shown) may then be formed to protect DBAR 40.

Corresponding contacts (not shown) and leads 462, 464 and 466 may then be formed as electrically connected respectively to first electrode 402, second electrode 404 and third electrode 406, as schematically shown. Leads 462 and 464 may be connected together, so that first and second electrodes 402 and 404 may be electrically connected together. A voltage V may be applied to DBAR 40 between lead 466, and a junction connecting leads 462 and 464. DBAR 40 thus includes first piezoelectric layer 412 sandwiched between first and third electrodes 402 and 406, and second piezoelectric layer 420 sandwiched between second and third electrodes 404 and 406. In this representative embodiment, DBAR 40 of FIG. 4 may thus be characterized as having a second FBAR stacked upon a first FBAR, wherein the c-axis orientations of the two FBARs are the same. DBAR 40 operates in lambda mode, resulting in a higher resonance for high frequency operation.

In other representative embodiments, the piezoelectric material of first piezoelectric layer 312 (412) and the piezoelectric material of second piezoelectric layer 320 (420) may be combinations of AlN, ZnO, PVDF and PZT, for example. The thicknesses of first and second electrodes 302 (402) and 304 (404), and third electrode 306 (406) may typically be in a range of about several hundred angstroms to a micron for example. The thicknesses of first piezoelectric layer 312 (412) and second piezoelectric layer 320 (420) may typically be in a range of about several hundred angstroms to a few microns for example. It should however be understood that the thicknesses of the various layers and the piezoelectric material as noted above are merely given as examples, and may be varied in accordance with specific applications as would be understood by one of ordinary skill. Also, the layers may be juxtaposed, so that first piezoelectric layer 312 (112) may be ZnO, and second piezoelectric layer 320 (420) may be AlN.

Table 2 shows example thicknesses, along with corresponding c-axis orientations and resultant resonance frequencies, for the DBARs of the representative embodiments shown in FIGS. 3 and 4.

TABLE 2

| Layer | Thickness (Å) | FIG. 3 c-axis | FIG. 3 Fs (MHz) | FIG. 4 c-axis | FIG. 4 Fs (MHz) |
|---|---|---|---|---|---|
| top (second) electrode (W) | 12390 | | 350 | | 688 |
| piezoelectric layer 2 (ZnO) | 14320 | ↓↓↓ | | ↑↑↑ | |
| middle (third) electrode (W) | 10000 | | | | |
| piezoelectric layer 1 (AlN) | 18000 | ↑↑↑ | | ↑↑↑ | |
| bottom (first) electrode (W) | 12390 | | | | |

In both cases, the thicknesses of the first electrode, the first piezoelectric layer, the third electrode, the second piezoelectric layer and the second electrode of DBARs 30 and 40 shown in FIGS. 3 and 4 are respectively set to 12390 Å, 18000 Å, 10000 Å, 11320 Å and 12390 Å. DBAR 30 as shown in FIG. 3 including the corresponding layer thicknesses with first piezoelectric layer 312 and second piezoelectric layer 320 having respective different (opposite) c-axis orientations has a resonance frequency of about 350 MHz. DBAR 40 as shown in FIG. 4 including the corresponding layer thicknesses with first piezoelectric layer 412 and second piezoelectric layer 420 having the same c-axis orientations has a resonance frequency of about 688 MHz.

Accordingly, as can be understood in view of Table 2, the corresponding resonance frequencies of the DBARs 30 and 40 of the representative embodiments having first and second piezoelectric layers of different respective piezoelectric material can be controlled or set by merely selecting the c-axis orientations of the first and second piezoelectric layers to be formed. That is, in the case of the representative embodiments having the representative thicknesses in Table 2, when first and second piezoelectric layers 312 and 320 are selected to be different (opposite) as in the case of DBAR 30 shown in FIG. 3, the resonance frequency is set to about 350 MHz. When first and second piezoelectric layers 412 and 420 are selected to be the same as in the case of DBAR 40 shown in FIG. 4, the resonance frequency is set to about 688 MHz.

In contrast, with acoustic resonators made of conventional stacked FBARs (DBARs) which have piezoelectric layers constituted of the same piezoelectric material, resonance frequency can be changed primarily by varying a thickness of the piezoelectric layers and/or the electrodes. That is, the resonance frequency of acoustic resonators made of such conventional stacked FBARs may be increased by making the piezoelectric layers thinner. The resonance frequency of acoustic resonators made of such conventional stacked FBARs may be decreased by making the piezoelectric layers thicker.

By growing second piezoelectric layer 420 to have a same c-axis orientation as first piezoelectric layer 412 as shown in FIG. 4, DBAR 40 may be realized as having a higher resonance frequency without decreasing the overall thickness of DBAR 40, as would be necessary to increase the resonance frequency of a conventional stacked FBAR. In accordance with the representative embodiments, DBARs of extended high frequency range may be constructed without decreased thickness. Also, by growing second piezoelectric layer 320 to have a different (opposite) c-axis orientation than first piezoelectric layer 312, DBAR 30 as shown in FIG. 3 may be realized as having a lower resonance frequency without increasing overall thickness, as would be necessary to lower the resonance frequency of a conventional stacked FBAR. In accordance with the representative embodiments, DBARs of extended low frequency range may be constructed without increased thickness. Excessively thick DBARs result in increased resonator size, processing difficulties and cost.

Figure 5:
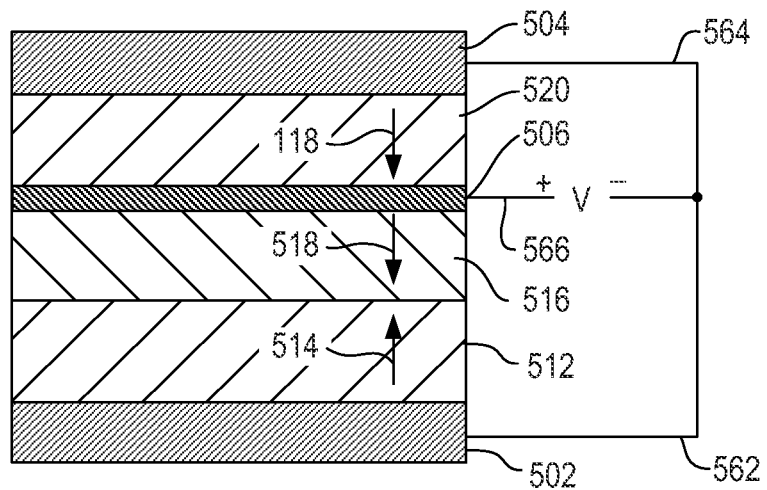
FIG. 5 is a cross-sectional view illustrating a DBAR, according to a representative embodiment.

FIG. 5 shows a cross-sectional view of DBAR 50, in accordance with a representative embodiment. DBAR 50 may include similar features as FBAR 10 and DBAR 40 as respectively shown in FIGS. 1 and 4, including somewhat similar reference numerals. Description of such similar features may be omitted from the following. DBAR 50 may be formed on a substrate such as substrate 150 which includes cavity 152 as shown in FIG. 1 for example. However, a corresponding substrate and cavity are omitted from FIG. 5 for the sake of simplifying the figure.

DBAR 50 as shown in FIG. 5 may include a first (bottom) electrode 502, which may be tungsten (W), molybdenum (Mo) or aluminum (Al), on a substrate (not shown), and may further include first piezoelectric layer 512, which may be a piezoelectric material such as AlN, on first electrode 502. First piezoelectric layer 512 may be formed by plasma deposition for example, and may have a (first) e-axis orientation indicated by arrow 514 that is a normal c-axis orientation for AlN. A piezoelectric material such as zinc oxide (ZnO) may then be directly deposited on first piezoelectric layer 512 by plasma deposition, to form third piezoelectric layer 516 having a (third) c-axis orientation as indicated by arrow 518 that is a normal c-axis orientation for ZnO. First piezoelectric layer 512 and third piezoelectric layer 516 are laminated together. In this representative embodiment, first and third piezoelectric layers 512 and 516 are respective different piezoelectric materials. Also, the c-axis orientation of first piezoelectric layer 512 as indicated by arrow 514 is opposite the c-axis orientation of third piezoelectric layer 516 as indicated by arrow 518.

DBAR 50 may also include a third (middle) electrode 506 thrilled on third piezoelectric layer 516. A layer of tungsten (W), molybdenum (Mo) or aluminum (Al), for example, may be deposited on third piezoelectric layer 516 to form third (middle) electrode 506. DBAR 50 may further include a second piezoelectric layer 520, which may be a piezoelectric material such as ZnO, on third electrode 506. Second piezoelectric layer 520 may be formed by plasma deposition for example, to have a (second) c-axis orientation as indicated by arrow 522 that is a normal c-axis orientation for ZnO. In this representative embodiment, first and second piezoelectric layers 512 and 520 are respective different piezoelectric materials. Also, the c-axis orientation of first piezoelectric layer 512 as indicated by arrow 514 is different (opposite) than the e-axis orientation of second piezoelectric layer 520 as indicated by arrow 522. A layer of tungsten (W), molybdenum (Mo) or aluminum (Al), for example, may then be deposited on second piezoelectric layer 520 to form second (top) electrode 504. First, second and third piezoelectric layers 512, 520 and 516, and second and third electrodes 504 and 506, may then be patterned to form DBAR 50. The sacrificial material may then be removed from the corresponding cavity (not shown) by etching. An overlying passivation layer (not shown) may then be formed to protect DBAR 50.

Corresponding contacts (not show and leads 562, 564 and 566 may then be formed as electrically connected respectively to first electrode 502, second electrode 504 and third electrode 506, as schematically shown. Leads 562 and 564 may be connected together, so that first and second electrodes 502 and 504 may be electrically connected together. A voltage V may be applied to DBAR 50 between lead. 566, and a junction connecting leads 562 and 564. DBAR 50 thus includes first piezoelectric layer 512 and third piezoelectric layer 516 sandwiched between first and third electrodes 502 and 506, and second piezoelectric layer 520 sandwiched between second and third electrodes 504 and 506. In this representative embodiment, DBAR 50 of FIG. 5 may thus be characterized as having a first FBAR including piezoelectric layers of respective different piezoelectric materials, with a second FBAR stacked upon the first FBAR.

In a further representative embodiment, either or both of second and third piezoelectric layers 520 and 516 of FBAR 50 in FIG. 5 may be formed by plasma deposition to instead have c-axis orientations that are reverse c-axis orientations for ZnO. In a still further representative embodiment, either one of first and third piezoelectric layers 512 and 516 may be omitted, and an additional piezoelectric layer may be laminated to second piezoelectric layer 520, whereby the additional piezoelectric layer and second piezoelectric layer 520 are different respective piezoelectric materials. In a further representative embodiment, the layers of DBAR 50 may be juxtaposed, so that first piezoelectric layer 512 may be ZnO, and second and third piezoelectric layers 520 and 516 may be AlN. In still further representative embodiments, DBARs having similar structure as shown in FIG. 5 may include various combinations of respective piezoelectric layers of different piezoelectric material and different c-axis orientation.

Figure 6:
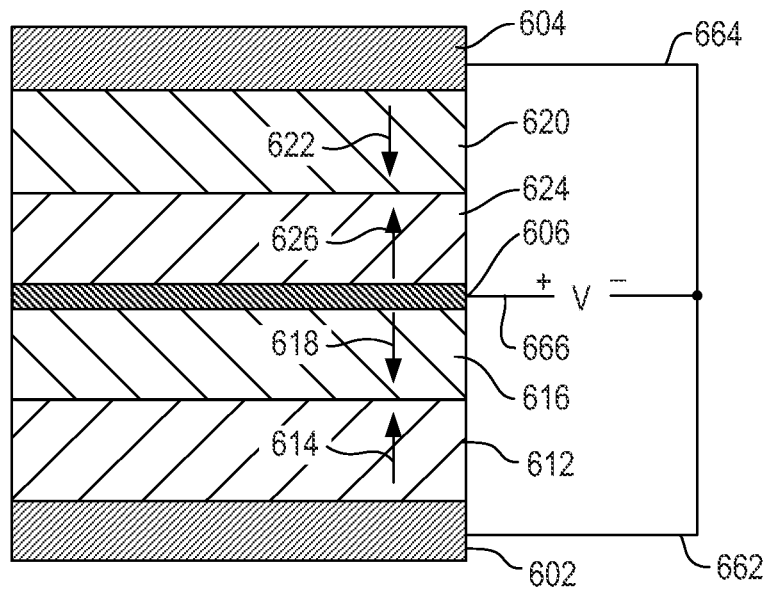
FIG. 6 is a cross-sectional view illustrating a DBAR, according to a representative embodiment.

FIG. 6 shows a cross-sectional view of DBAR 60, in accordance with a representative embodiment. DBAR 60 may include similar features as FBAR 10 and DBAR 50 as respectively shown in FIGS. 1 and 5, including somewhat similar reference numerals. Description of such similar features may be omitted from the following. DBAR 60 may be formed on a substrate such as substrate 150 which includes cavity 152 as shown in FIG. 1 for example. However, a corresponding substrate and cavity are omitted from FIG. 5 for the sake of simplifying the figure.

DBAR 60 as shown in FIG. 6 may include a first (bottom) electrode 602, which may be tungsten (W), molybdenum (Mo) or aluminum (Al), on a substrate (not shown), and may further include first piezoelectric layer 612, which may be a piezoelectric material such as AlN, on first electrode 602. First piezoelectric layer 612 may be formed by plasma deposition for example, and may have a (first) c-axis orientation indicated by arrow 614 that is a normal c-axis orientation for AlN. A piezoelectric material such as zinc oxide (ZnO) may then be directly deposited on first piezoelectric layer 612 by plasma deposition, to form third piezoelectric layer 616 having a (third) c-axis orientation as indicated by arrow 618 that is a normal c-axis orientation for ZnO. First piezoelectric layer 612 and third piezoelectric layer 616 are laminated together, in this representative embodiment, first and third piezoelectric layers 612 and 616 are respective different piezoelectric materials. Also, the c-axis orientation of first piezoelectric layer 612 as indicated by arrow 614 is opposite the c-axis orientation of third piezoelectric layer 616 as indicated by arrow 618.

DBAR 60 may also include a third (middle) electrode 606 formed on third piezoelectric layer 616. A layer of tungsten (W), molybdenum (Mo) or aluminum (Al), for example, may be deposited on third piezoelectric layer 616 to form third (middle) electrode 606. DBAR 60 may further include fourth piezoelectric layer 624, which may be a piezoelectric material such as AlN, on third electrode 606. Fourth piezoelectric layer 624 may be formed by plasma deposition for example, and may have a (fourth) c-axis orientation indicated by arrow 626 that is a normal c-axis orientation for AlN. DBAR 60 may still further include a second piezoelectric layer 620, which may be a piezoelectric material such as ZnO, on fourth piezoelectric layer 624. Second piezoelectric layer 620 may be formed by plasma deposition for example, to have a (second) c-axis orientation as indicated by arrow 622 that is a normal c-axis orientation for ZnO. Second piezoelectric layer 620 and fourth piezoelectric layer 624 are laminated together. In this representative embodiment, second and fourth piezoelectric layers 620 and 624 are respective different piezoelectric materials. Also, the c-axis orientation of second piezoelectric layer 620 as indicated by arrow 622 is different (opposite) the c-axis orientation of fourth piezoelectric layer 624 as indicated by arrow 626. A layer of tungsten (W), molybdenum (Mo) or aluminum (Al), for example, may then be deposited on second piezoelectric layer 620 to form second (top) electrode 604. Second, third and fourth piezoelectric layers 620, 616 and 624, and second and third electrodes 604 and 606 may then be patterned to form DBAR 60. The sacrificial material may then be removed from the corresponding cavity (not shown) by etching. An overlying passivation layer (not shown) may then be formed to protect DBAR 60.

Corresponding contacts (not shown) and leads 662, 664 and 666 may then be formed as electrically connected respectively to first electrode 602, second electrode 604 and third electrode 606, as schematically shown. Leads 662 and 664 may be connected together, so that first and second electrodes 602 and 604 may be electrically connected together. A voltage V may be applied to DBAR 60 between lead 666, and a junction connecting leads 662 and 664. DBAR 60 thus includes first piezoelectric layer 612 and third piezoelectric layer 616 sandwiched between first and third electrodes 602 and 606, and second piezoelectric layer 620 and fourth piezoelectric layer 624 sandwiched between second and third electrodes 604 and 606. In this representative embodiment, DBAR 60 of FIG. 6 may thus be characterized as having a first FBAR including piezoelectric layers of respective different piezoelectric materials, with a second FBAR including piezoelectric layers of respective different piezoelectric materials stacked upon the first FBAR.

In a further representative embodiment, either or both of second and third piezoelectric layers 620 and 616 of DBAR 60 in FIG. 6 may be formed by plasma deposition to instead have c-axis orientations that are reverse c-axis orientations for ZnO. In a further representative embodiment, the layers of DBAR 60 may be juxtaposed, so that first and fourth piezoelectric layers 612 and 624 may be ZnO, and second and third piezoelectric layers 620 and 616 may be AlN. In still further representative embodiments, DBARs having similar structure as shown in FIG. 6 may include various combinations of respective piezoelectric layers of different piezoelectric material and different c-axis orientation.

Accordingly, by appropriate selection of layer material and c-axis orientation, the DBARs configured as in FIGS. 3-6 may be designed to have different resonant harmonics, to consequently design filters for different frequency ranges.

It should be understood that the specific configurations of FBARs 10 and 20, and DBARs 30, 40, 50 and 60 discussed above are illustrative, and that the various parameters and characteristics described herein may be varied to provide unique benefits for any particular situation or to meet application specific design requirements. Further, although example combinations of piezoelectric materials and c-axis orientations are described, various other combinations of piezoelectric materials and c-axis orientations may be incorporated, without departing from the scope of the present teachings. Also, although the corresponding ZnO piezoelectric layers are described as deposited as having either normal or reverse c-axis orientations, the corresponding AlN piezoelectric layers may in the alternative or additionally be deposited as having either one of normal and reverse c-axis orientations. Also, the ZnO piezoelectric layers having reverse c-axis orientation are described as formed by first depositing a thin seed layer of Zn, followed by growth of ZnO on the seed layer by standard plasma deposition. However, formation of the piezoelectric layers having reverse c-axis orientation should not be limited to the manner described.

Additionally, in farther representative embodiments, two different devices may be built on a same wafer. For example, a first device may be a composite FBAR with different first and second piezoelectric layers as shown in either of FIGS. 1 and 2, and a second device may be an FBAR having a single piezoelectric layer wherein either of the first and second piezoelectric layers deposited to form the composite FBAR has been removed or omitted. The two devices on the same wafer may thus have dramatically different resonance frequencies, enabling efficient and simple construction of multi-frequency filters on a same wafer.

Notably, the teachings of the incorporated patents and applications are intended to be illustrative of methods, materials and structures useful to the present teachings, but should not in any way be considered as limiting the present teachings. The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. An acoustic resonator, comprising:
   a first electrode;
   a second electrode;
   a first piezoelectric layer and a second piezoelectric layer between the first and second electrodes, the first and second piezoelectric layers being comprised of respective different piezoelectric materials;
   a third electrode between the first and second piezoelectric layers; and
   a third piezoelectric layer laminated to the first piezoelectric layer, the third piezoelectric layer comprising a piezoelectric material different than the piezoelectric material of the first piezoelectric layer.

2. The acoustic resonator of claim 1, wherein a c-axis orientation of the first piezoelectric layer is the same as a c-axis orientation of the second piezoelectric layer.

3. The acoustic resonator of claim 1, wherein a c-axis orientation of the first piezoelectric layer is opposite a c-axis orientation of the second piezoelectric layer.

4. The acoustic resonator of claim 1, wherein the first piezoelectric layer comprises AlN and the second piezoelectric layer comprises ZnO.

5. The acoustic resonator of claim 4, wherein the first and second electrodes are comprised of W or Mo.

6. The acoustic resonator of claim 1, wherein the first and second electrodes are electrically connected to each other.

7. The acoustic resonator of claim 1, further comprising a fourth piezoelectric layer laminated to the second piezoelectric layer, the fourth piezoelectric layer comprising a piezoelectric material different than the piezoelectric material of the second piezoelectric layer.

8. The acoustic resonator of claim 7, wherein a c-axis orientation of the fourth piezoelectric layer is the same as a c-axis orientation of the second piezoelectric layer.

9. The acoustic resonator of claim 7, wherein a c-axis orientation of the fourth piezoelectric layer is opposite a c-axis orientation of the second piezoelectric layer.

10. The acoustic resonator of claim 1, having a resonance frequency set based on respective c-axis orientations of the first and second piezoelectric layers.

11. The acoustic resonator of claim 1, wherein a c-axis orientation of the third piezoelectric layer is opposite a c-axis orientation of the first piezoelectric layer.

12. The acoustic resonator of claim 1, wherein a c-axis orientation of the third piezoelectric layer is the same as a c-axis orientation of the first piezoelectric layer.

13. A method of making an acoustic resonator, the method comprising:
    forming a first piezoelectric layer having a first c-axis orientation on first electrode;
    forming a second piezoelectric layer having a second c-axis orientation over the first piezoelectric layer, the first and second piezoelectric layers comprised of respective different piezoelectric materials;
    selecting the second c-axis orientation during formation of the second piezoelectric layer to set a resonance frequency of the acoustic resonator; and
    forming a second electrode on the second piezoelectric layer;
    forming a third electrode between the first and second piezoelectric layers;
    electrically connecting the first and second electrodes together; and
    laminating a third piezoelectric layer to the first piezoelectric layer, the third piezoelectric layer comprising a piezoelectric material different than a piezoelectric material of the first piezoelectric layer, wherein the first and second c-axis orientations are selected to be the same to set a first resonance frequency and are selected to be opposite to set a different second resonance frequency.

14. The method of claim 13, thither comprising laminating a fourth piezoelectric layer to the second piezoelectric layer, the fourth piezoelectric layer comprising a piezoelectric material different than a piezoelectric material of the second piezoelectric layer.

* * * * *